United States Patent
Wade et al.

(10) Patent No.: US 10,571,348 B2
(45) Date of Patent: Feb. 25, 2020

(54) OVERFORCE CONTROL THROUGH SENSE DIE DESIGN

(71) Applicant: Honeywell International Inc., Morris Plains, NJ (US)

(72) Inventors: Richard Wade, Worthington, OH (US); Richard Alan Davis, Plano, TX (US)

(73) Assignee: Honeywell International Inc., Morris Plains, NJ (US)

( * ) Notice: Subject to any disclaimer, the term of this patent is extended or adjusted under 35 U.S.C. 154(b) by 305 days.

(21) Appl. No.: 15/251,384

(22) Filed: Aug. 30, 2016

(65) Prior Publication Data

US 2018/0058955 A1    Mar. 1, 2018

(51) Int. Cl.
| | |
|---|---|
| *G01L 1/18* | (2006.01) |
| *G01L 9/00* | (2006.01) |
| *G01L 19/14* | (2006.01) |
| *B81B 3/00* | (2006.01) |
| *B81C 1/00* | (2006.01) |
| *G01L 1/04* | (2006.01) |
| *G01L 1/22* | (2006.01) |

(52) U.S. Cl.
CPC .............. *G01L 1/18* (2013.01); *B81B 3/0051* (2013.01); *B81C 1/00158* (2013.01); *G01L 1/04* (2013.01); *G01L 1/2262* (2013.01); *G01L 1/2293* (2013.01); *G01L 9/0042* (2013.01); *G01L 19/14* (2013.01); *G01L 19/147* (2013.01); *B81B 2203/0127* (2013.01); *G01L 2009/0066* (2013.01)

(58) Field of Classification Search
CPC . G01L 1/04; G01L 1/18; G01L 1/2231; G01L 1/2262; G01L 1/2293; G01L 9/0042; G01L 19/14; G01L 19/147; G01L 3/108; G01L 2009/0066; B81B 3/0051; B81B 2203/0127; B81C 1/00158
USPC ..................................................... 73/862.627
See application file for complete search history.

(56) References Cited

U.S. PATENT DOCUMENTS

| | | | | |
|---|---|---|---|---|
| 5,200,363 | A * | 4/1993 | Schmidt ................ | G01L 9/0054 257/E23.067 |
| 5,634,999 | A * | 6/1997 | Takeuchi .............. | G01L 9/0042 156/89.11 |
| 6,365,968 | B1 | 4/2002 | Qian et al. | |
| 8,033,177 | B2 * | 10/2011 | Keilman ............... | G01L 9/0073 73/715 |
| 8,316,725 | B2 * | 11/2012 | Wade ........................ | G01L 1/18 73/760 |
| 8,426,930 | B2 * | 4/2013 | Holzmann ............ | B81B 7/0054 257/415 |
| 8,806,964 | B2 * | 8/2014 | Thanigachalam .... | G01L 9/0054 73/862.627 |

(Continued)

*Primary Examiner* — Octavia Hollington
(74) *Attorney, Agent, or Firm* — Seager, Tufte & Wickhem LLP

(57) ABSTRACT

A sense die comprises a chip comprising a sense diaphragm, one or more sense elements supported by the diaphragm, one or more bond pads supported by a first side of the chip, a structural frame disposed on the first side of the chip, and one or more electrical contacts extending through the structural frame. Each of the one or more bond pads is electrically coupled to at least one of the one or more sense elements. The structural frame is disposed at least partially about the diaphragm, and the one or more electrical contacts are electrically coupled to the one or more bond pads.

13 Claims, 5 Drawing Sheets

(56) References Cited

U.S. PATENT DOCUMENTS

| | | | |
|---|---|---|---|
| 9,003,899 B2 * | 4/2015 | Wade | G01L 1/18 |
| | | | 73/760 |
| 9,032,818 B2 | 5/2015 | Campbell et al. | |
| 9,034,666 B2 | 5/2015 | Vaganov et al. | |
| 9,410,861 B2 * | 8/2016 | Wade | G01L 7/08 |
| 9,995,641 B2 * | 6/2018 | Wade | G01L 19/0618 |
| 10,001,418 B1 * | 6/2018 | Machir | G01L 1/005 |
| 2013/0341742 A1 | 12/2013 | Brosh | |

* cited by examiner

OVERFORCE CONTROL THROUGH SENSE DIE DESIGN

CROSS-REFERENCE TO RELATED APPLICATIONS

Not applicable.

STATEMENT REGARDING FEDERALLY SPONSORED RESEARCH OR DEVELOPMENT

Not applicable.

REFERENCE TO A MICROFICHE APPENDIX

Not applicable.

BACKGROUND

Force sensors can be used to measure a force or a pressure. Various designs can be used and can rely on a displacement of a component to measure the presence of a force and/or an amount of the force present on the sensor. Force sensors can experience forces above their designed operating ranges (e.g., overforce situations), which can result in damage to the force sensors.

SUMMARY

In an embodiment, a sense die comprises a chip comprising a sense diaphragm, one or more sense elements supported by the diaphragm, one or more bond pads supported by a first side of the chip, a structural frame disposed on the first side of the chip, and one or more electrical contacts extending through the structural frame. Each of the one or more bond pads is electrically coupled to at least one of the one or more sense elements. The structural frame is disposed at least partially about the diaphragm, and the one or more electrical contacts are electrically coupled to the one or more bond pads.

In an embodiment, a method of manufacturing a sense die comprises providing a wafer comprising a plurality of sense die, disposing a structural frame material on the wafer, wherein the structural frame material has a height, forming a structural frame around each diaphragm of each sense die, and dicing the wafer to form one or more sense die comprising a single diaphragm. Each sense die of the plurality of sense die comprise a chip having a diaphragm formed thereon.

In an embodiment, a sense die comprises a chip comprising a sense diaphragm, a structural frame disposed on the first side of the chip, and a substrate. The chip comprises a first side and a second side, and the structural frame is disposed at least partially about the diaphragm. The chip is coupled to the substrate, and the structural frame is in contact with a surface of the substrate. A height between a surface of the diaphragm on the first side of the chip and a surface of the substrate facing the diaphragm is determined by a height of the structural frame.

These and other features will be more clearly understood from the following detailed description taken in conjunction with the accompanying drawings and claims.

BRIEF DESCRIPTION OF THE DRAWINGS

For a more complete understanding of the present disclosure, reference is now made to the following brief description, taken in connection with the accompanying drawings and detailed description, wherein like reference numerals represent like parts.

DETAILED DESCRIPTION

Figure 1:
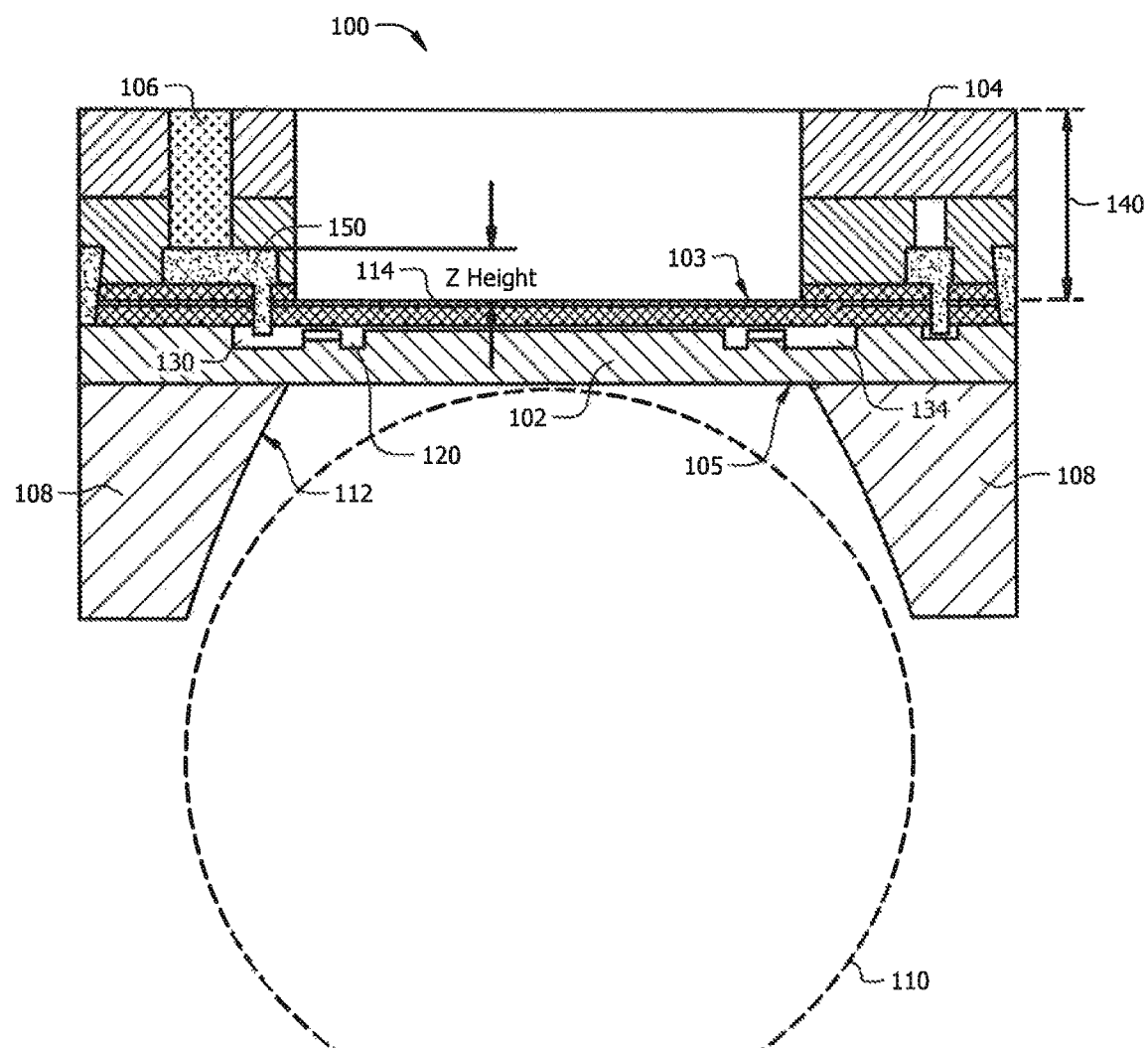
FIG. 1 is a schematic cross-sectional view of an embodiment of a sense die.

It should be understood at the outset that although illustrative implementations of one or more embodiments are illustrated below, the disclosed systems and methods may be implemented using any number of techniques, whether currently known or not yet in existence. The disclosure should in no way be limited to the illustrative implementations, drawings, and techniques illustrated below, but may be modified within the scope of the appended claims along with their full scope of equivalents.

The following brief definition of terms shall apply throughout the application:

The term "comprising" means including but not limited to, and should be interpreted in the manner it is typically used in the patent context;

The phrases "in one embodiment," "according to one embodiment," and the like generally mean that the particular feature, structure, or characteristic following the phrase may be included in at least one embodiment of the present invention, and may be included in more than one embodiment of the present invention (importantly, such phrases do not necessarily refer to the same embodiment);

If the specification describes something as "exemplary" or an "example," it should be understood that refers to a nonexclusive example;

The terms "about" or "approximately" or the like, when used with a number, may mean that specific number, or alternatively, a range in proximity to the specific number, as understood by persons of skill in the art field; and If the specification states a component or feature "may," "can," "could," "should," "would," "preferably," "possibly," "typically," "optionally," "for example," "often," or "might" (or other such language) be included or have a characteristic, that particular component or feature is not required to be included or to have the characteristic. Such component or feature may be optionally included in some embodiments, or it may be excluded.

Most force sensors can experience overforce levels that are a multiple of their measurement range. For example, force sensors should be capable of handling installation forces (e.g., the force of a human hand preparing the sensor), which can be much greater than the actual measurement range of the sensor. Various overforce protection features can be used to protect against damage to a diaphragm in the event of an overforce condition, such as mechanical diaphragm stops. In addition, various attachment mechanisms can be used to both mechanically attach a sense die to a substrate, such as solder balls, wire bonds, adhesives, and the like. These mechanical attachments are subject to deformation under certain loads.

As disclosed herein, a sense die can have a structural frame formed around a side of the sense die that can be used to determine an offset height of the diaphragm from a surface of a substrate. The control of the offset height can then allow the substrate to act as a mechanical stop for the diaphragm to protect against damage during an overforce condition. Electrical contacts can be formed through the structural frame to provide a connection between the sense die and contacts on the substrate. This may avoid the need to solder balls that can deform under pressure, such as the installation forces. By avoiding deformation of the solder balls or other mechanical connections, the offset height can be accurately set and maintained during use.

The structural frame can be formed from an insulating material. In some instances, a protective coating can be formed on the diaphragm surface that can contact the surface of the substrate to protect the diaphragm in the event the diaphragm flexes into contact with the surface of the substrate. The structural frame can comprise a material formed over or in place of the protective coating, or in some embodiments, the protective coating can be used to form the structural frame. The sense die can then be flip-chip mounted on the substrate so that the structural frame supports the sense die and sets the offset height. In some embodiments, the structural frame can be formed at a wafer level manufacturing process to allow the height of the structural frame to be accurately formed and be repeatable across a plurality of sense die.

Figure 2:
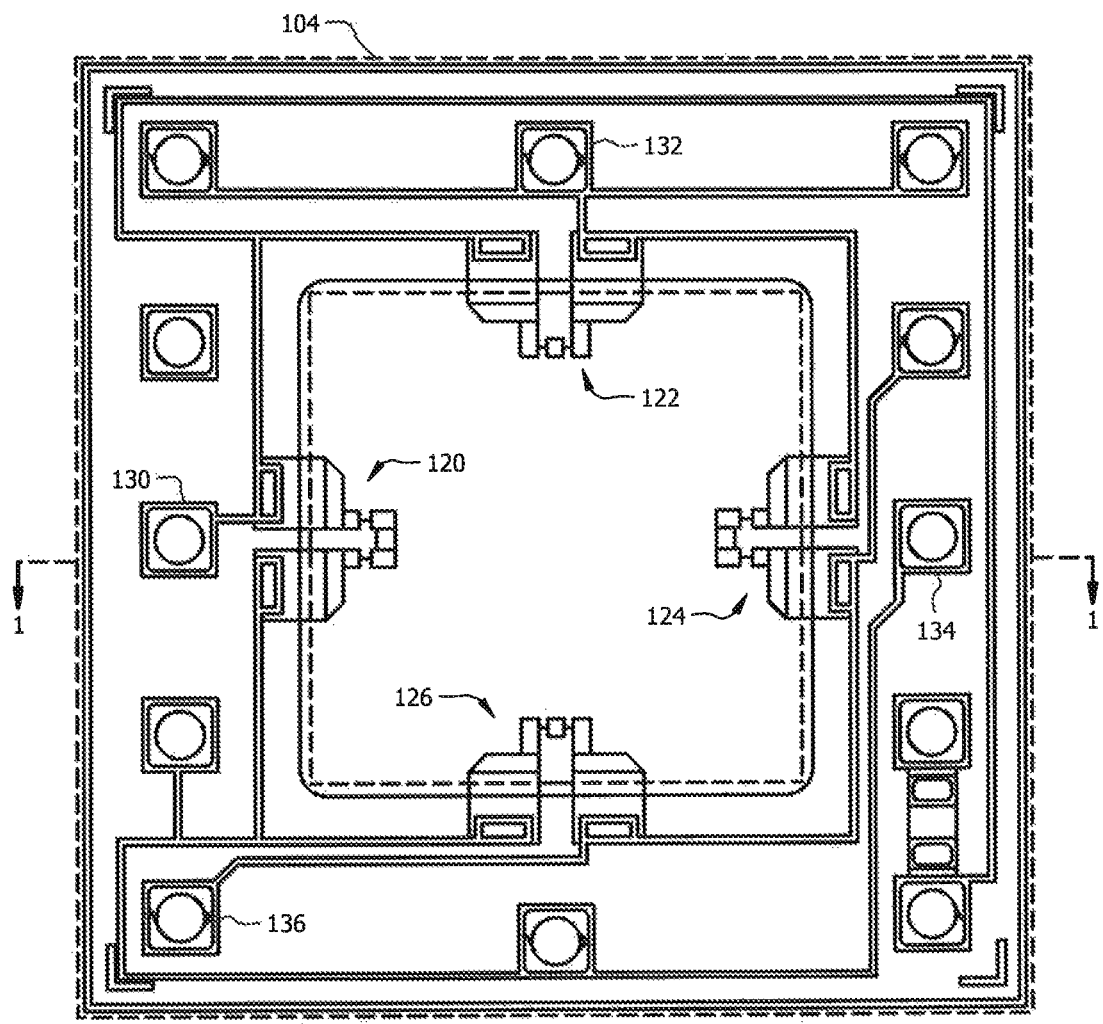
FIG. 2 is a schematic top view of a sense die according to an embodiment, where the structural frame is shown in dashed lines.
Figure 3:
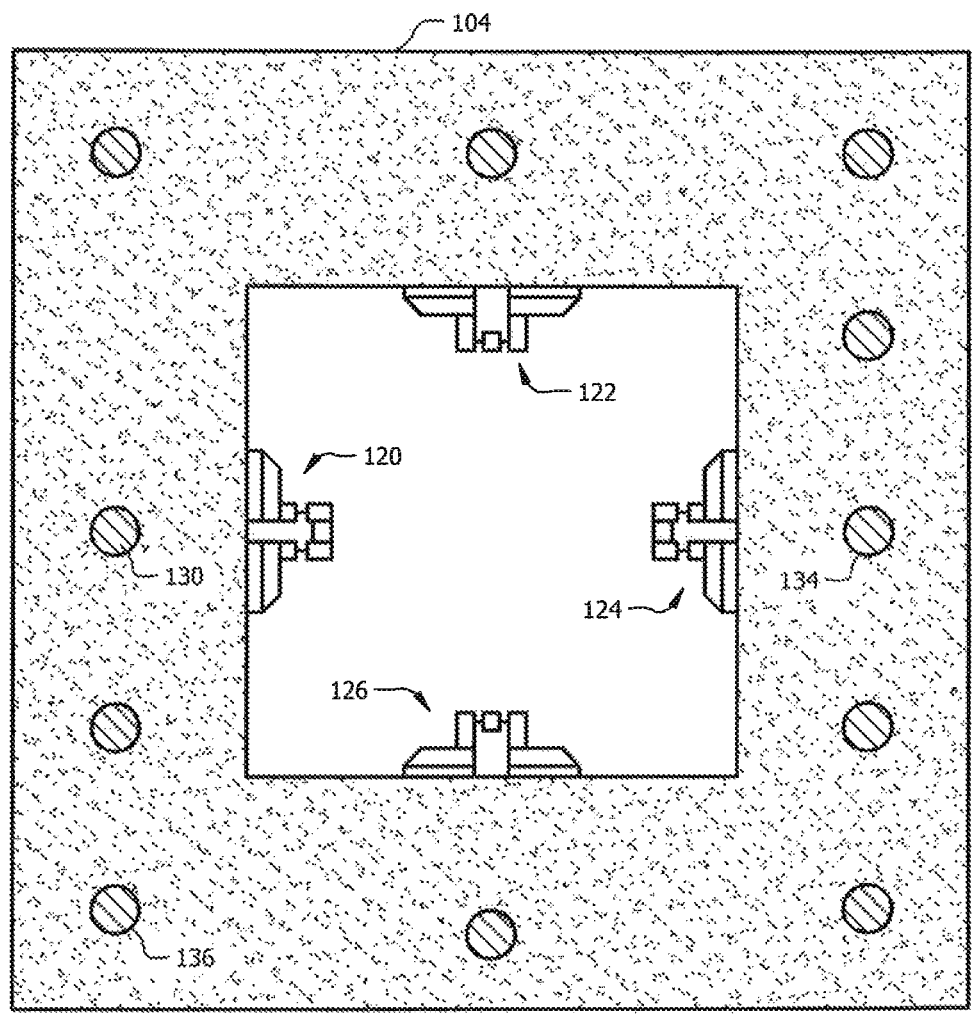
FIG. 3 is another schematic top view of a sense die according to an embodiment.

FIGS. 1-3 illustrate an embodiment of a sense die 100 according to some embodiments that can be used to detect a force, including a pressure. As shown, the sense die 100 can include a thinned portion or diaphragm 102, a structural frame 104 element disposed about a first surface 103 of the sensor, and one or more electrical contacts 106 extending through the structural frame 104. A base sidewall 108 can form a portion of a second surface 105 of the sensor. An optional actuation element 110 can be present within a cavity 112 formed by the base sidewall 108 and can serve to transfer a force to the diaphragm 102. An optional coating 114 can also be present on the first surface 103 in some embodiments.

The sense die 100 may be formed from silicon or other semiconductor material. While the sense die 100 is described with respect to being formed from silicon, it should be understood that other materials can also be used. In an embodiment, the sense die 100 can begin as a silicon chip and be processed to form the sense die 100, as described in more detail herein. The silicon chip may include a recess formed on the second side 105 to form the diaphragm 102 as a thinned region of the silicon die. A variety of microfabrication techniques including, but not limited to, lithography techniques, wet etching techniques, and dry etching techniques may be used to form the recess. In some embodiments, the sensing diaphragm 102 may be fabricated on the sense die 100 by back-side etching of a silicon die (e.g., with a KOH etching technique, deep reactive ion etching, or other etching technique). However, it is contemplated that any suitable process may be used, as desired. The diaphragm 102 may have a height or thickness that is less than the thickness of the edges of the sense die 100, thereby forming the diaphragm 102.

The diaphragm 102 is configured to flex in response to an applied force, thereby allowing the applied force to be determined. In some embodiments, the applied force can be present in the form of a differential pressure across the diaphragm. In some embodiments, an optional actuation element 110 may be in contact with the second side 105 of the diaphragm 102 to transfer a force to the diaphragm 102. The actuation element 110 can comprise a mechanical coupling between an exterior force and the diaphragm 102. In some aspects, the first actuation element 110 can comprise a mechanical actuation element configured to transfer a force to the diaphragm 102. In sonic embodiments, the actuation element 110 may include a spherical object (such as the sphere shown in FIG. 1), a pin, an extender, a button, any other activation device, and/or a combination thereof. It may be appreciated that other types of actuators may be utilized, such as, for example, slidable mounted plungers or shafts, point of contact type components other than spherical objects, and/or "T"-shaped transfer mechanisms, in accordance with alternative embodiments. If desired, only a portion of an outer surface of the actuation element 110 may be spherical in shape or take on a particular shape. The actuation element 110 may be made of any material. For example, the actuation element 110 may be formed from stainless steel, a polymer, a ceramic, jeweled, another suitable metal, and/or another suitable material. In some cases, the actuation element 110 may include a stainless steel ball bearing. It is contemplated, however, that other generally spherical and other shaped elements may be used as or as part of the actuation element 110, if desired, including polymer based objects.

In some embodiments, the actuation element 110 can comprise a force transfer material, such as a gel. This may provide protection and media isolation of the sense die 100 from an external environment adjacent the sense die 100. The gel may fluidly communicate an externally-applied force to the sense diaphragm 102. Any externally applied force can then be transmitted through the gel to the diaphragm 102, where the force can be measured based on the deflection of the diaphragm 102. In some embodiments, the gel can comprise any suitable material for transferring a force or pressure through the gel to the sense diaphragm, such as silicone gel.

The deflection resulting from a force applied on the diaphragm through an applied pressure and/or through the optional actuation element 110 may generally result in the deflection of the diaphragm 102. The diaphragm 102 may be configured to detect a deflection that is predominantly in a direction perpendicular to the plane of the diaphragm 102. In this sense, the sense die 100 is configured to measure a uniaxial force that is provided normal to the plane of sense die 100.

As best shown in FIG. 2 and FIG. 3, the sense die 100 may have one or more sensing elements 120, 122, 124, 126 disposed on or adjacent to the diaphragm 102, such as piezoresistive sensing elements or components formed using suitable fabrication or printing techniques. For example, starting with the silicon sense die 100, standard pattern, implant, diffusion, and/or metal interconnect processes may be used to form one or more elements 120, 122, 124, 126 on a surface 103, 105 of the silicon die. For example, one or more piezoresistive sense elements 120, 122, 124, 126 may be formed on the diaphragm 102. The piezoresistive sense elements 120, 122, 124, 126 may be configured to have an electrical resistance that varies according to an applied mechanical stress (e.g. deflection of the diaphragm 102). The piezoresistive sense elements 120, 122, 124, 126 can thus be used to convert the applied force or pressure into an electrical signal. In some instances, the piezoresistive components may include a silicon piezoresistive material; however, other non-silicon materials may be used.

One or more bond pads 130, 132, 134, 136 may be formed on the upper surface 103 of the silicon die 100 and adjacent to the diaphragm 102. Metal, diffusion, or other interconnects may be provided to interconnect the one or more piezoresistive sensor elements 120, 122, 124, 126 and the one or more bond pads 130, 132, 134, 136. As shown in FIG. 2, one or more of the piezoresistive sensor elements 120, 122, 124, 126 can be electrically coupled to one or more of the bond pads 130, 132, 134,136.

In some embodiments, an optional protective coating 114 can be formed on the first side 103 of the sensor die. Various layers, such as a nitride, glass, semiconductor, or other material, can be disposed on the first side using various semiconductor manufacturing techniques. The protective coating 114 can be grown to a height above a final thickness and etched to a desired thickness. The etching may leave the protective layer with a greater height on the edges of the sensor die than over the diaphragm 102. In addition, etching or other techniques can be used to remove at least a portion of any protective coating 114 over the bond pads to allow an electrical connection to be formed through the protective coating 114.

In order to provide a desired height 140 between the first side 103 of the sensor die and a substrate (e.g., substrate 602 in FIG. 6), a structural frame 104 having a controlled height can be formed around the diaphragm 102 on the first surface 103 of the sensor die. As shown in FIGS. 1 and 3, the structural frame 104 can then serve to control the offset height 140 between the first side 103 of the diaphragm and the substrate during use. The controlled height may then allow the substrate to serve as a diaphragm stop or support to protect against over-flexing of the diaphragm 102 in response to an excessive force, thereby preventing damage to the diaphragm 102. The height 140 may vary depending on the degree of deflection of the diaphragm 102 allowed for a particular use. In some embodiments, the height 140 can be between about 0.1 to about 8 microns, or between about 1 micron and about 6 microns.

The structural frame 104 can comprise an insulating material disposed on the first surface 103 of the sensor die around the diaphragm 102. The structural frame 104 may not cover or otherwise extend over the diaphragm 102. In some embodiments, the structural frame 104 can completely encircle the diaphragm 102 without any breaks. In some embodiments, the structural frame 104 may partially encircle the diaphragm 102 or be formed as discontinuous pillars or supports at three or more points about the diaphragm 102, thereby providing the proper spacing without fully encircling the diaphragm 102. Various semiconductor manufacturing techniques, such as spin coating, lithography techniques, wet etching techniques, and dry etching techniques, may be used to form the structural frame 104 on the first surface 103 of the sensor die, as described in more detail herein.

In some embodiments, the structural frame 104 can be formed after the diaphragm, the piezoresistive sense elements 120, 122, 124, 126, and the one or more bond pads 130, 132, 134, 136 are formed. The structural frame 104 can then be formed at temperatures and using techniques suitable to protect the existing structures. In an embodiment, any suitable insulating material useful with semiconductor manufacturing techniques can be used to form the structural frame 104. In some embodiments, the structural frame 104 can be formed from a glass, ceramic, or polymeric material (e.g., polymers, elastomers, etc.). Exemplary materials can include, but are not limited to, silicon oxide, silicon nitride, silicon oxynitride, aluminum nitride, diamond like-carbon, boron-silicate glass, a spin-on glass, a silicone, a polymerized imide, a parylene, a polymerized benzocyclobutene, an organosilicate dielectric, a synthetic material, a cured resin, or any combination thereof.

In some embodiments, the protective coating 114 can form the structural frame 104. In this embodiment, the protective coating 114 may be grown to a desired height to form the structural frame 104, and the materials used for the protective coating 114 would then be the material used to form the structural frame 104. This embodiment may simplify the formation process by creating a single step to form the protective coating 114 as well as the structural frame 104.

Electrical contact between the one or more bond pads 130, 132, 134, 136 and external electrical connections can be made using conductive materials extending through the structural frame 104. As shown in FIG. 1, the electrical contacts 106 formed from conductive materials can be formed as pillars, traces, or other electrical contacts through or within the structural frame material. For example, an etching process can be used to form cavities within the structural frame material in alignment with the one or more bond pads 130, 132, 134, 136. The electrically conductive material can then be deposited within the cavities to form the electrical contacts 106. In some embodiments, electrical leadouts 150 or other conductive structures can be used to form a connection between an electrical contact 106 extending through the structural frame 104 and the one or more bond pads 130, 132, 134, 136 such that the one or more bond pads 130, 132, 134, 136 are not in alignment with the electrical contacts 106. This may allow a variety of spacings and alignments of the electrical contacts 106 with respect to the structural frame 104.

In an embodiment, the electrical contacts 106 can extend to and be substantially aligned with a surface of the structural frame 104. In some embodiments, the conductive material forming the electrical contacts 106 can extend slightly above the surface of the structural frame 104 and be deformed to be aligned with the surface of the structural frame upon the sensor die being mounted on a substrate. Any suitable number of electrical contacts 106 can be used to allow the sensor die to be coupled to corresponding bond pads or other electrical connections on a substrate.

Figure 4:
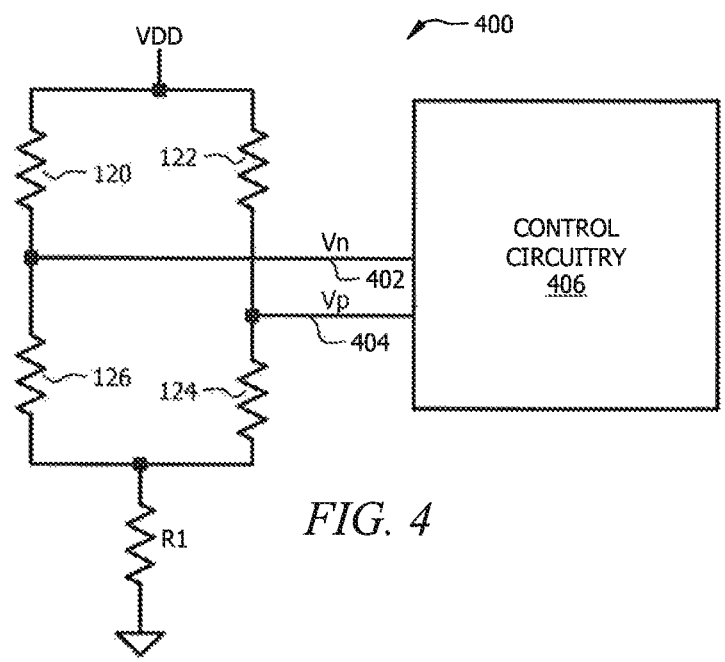
FIG. 4 is a schematic circuit diagram of an embodiment of resistive elements shown in a Wheatstone bridge configuration.

In some cases, the piezoresistive sense elements 120, 122, 124, 126 in the sensor can be connected in a Wheatstone bridge configuration (full or half bridge). FIG. 4 illustrates a schematic circuit diagram of a sense die 400 arranged in a full Wheatstone bridge. The sense die 400 can represent the sense die 100 arranged in a Wheatstone bridge configuration. In some embodiments, only two of the piezoresistive sense elements (e.g., elements 120, 124) may be provided, which in some cases can be connected in a half-bridge or other configuration. A differential output of the bridge can be taken between elements 120 and 126 (e.g., note Vn 402) and between elements 122 and 124 (e.g., node Vp 404). During use, a supply voltage VDD may be provided between elements 120 and 122, a reference voltage (e.g., ground or another reference voltage) may be connected between elements 126 and 124, either directly or through a resistor R1.

Figure 5:
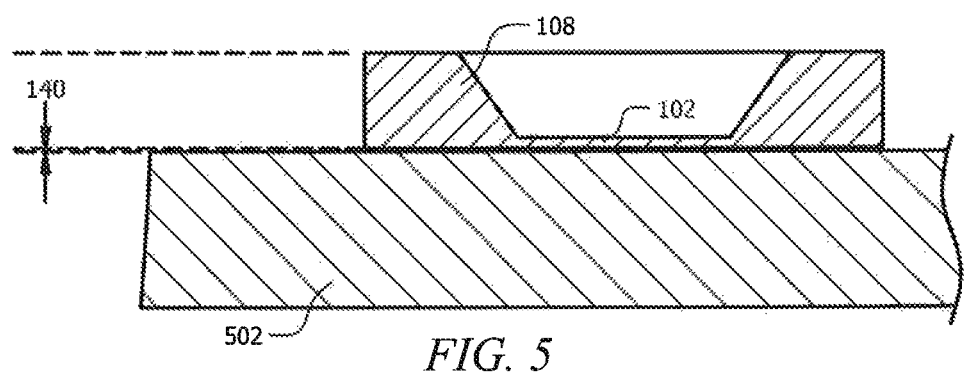
FIG. 5 is a schematic cross-sectional view of a sense die disposed on a substrate according to an embodiment.

As an example, signal conditioning circuitry 406 is illustrated in FIG. 4. In some cases, signal conditioning circuitry 406 can also be formed in or on the upper surface 103 of the silicon chip or can be present on an external substrate and can be electrically coupled to the one or more bond pads 130, 132, 134, 136. While various signal conditioning circuitry 406 can be used, in some aspects, the signal conditioning circuitry 406 may include a microprocessor, microcontroller, an application specific integrated circuit ("ASIC"), and/or an application specific standard product ("ASSP"). The signal conditioning circuitry 406 may include circuitry that receives an output signal from the sense die 400, and in response may generate an output signal whose magnitude is representative of a magnitude of the force applied to the sense die 400. The signal conditioning circuitry 406 may condition the output signal of the sense die to correct for repeatable variations, such as offset, sensitivity, non-linearity, temperature effects, and/or other variations, and/or amplify (e.g., convert the output signal from a millivolt output to a voltage output), or convert the output signal (e.g., analog to digital conversions, etc.). The signal conditioning circuitry 406 may condition the output signal to compensate for temperature-dependent variations in the electrical characteristics and/or to account for a nonlinear relationship between changes in the electrical characteristic and corresponding changes in the magnitude of the force. In some embodiments, the signal conditioning circuitry 406 can comprise a digital to analog converter (DAC) to provide a digital output. In some embodiments, the signal conditioning circuitry 406 can comprise an ASIC, As shown in FIG. 5, the sense die 100 can be mounted on a substrate 502. The substrate 502 can include a structure used to retain the sense die during use, including providing the signal conditioning circuitry as needed. For example, the substrate 502 can be a printed circuit board (PCB) to which the sense die is attached. The substrate 502 can comprise any suitable material, such as a ceramic, glass, metal, resin, polymer, or the like.

In the embodiment illustrated in FIG. 5 (and also with reference to FIG. 1), the sense die 100 can be flip-chip mounted to the substrate 502. As shown, the first side 103 of the sense die 100 (e.g., the side of the sense die 100 with the sensing elements) can face downward (e.g., "downward" is with respect to the orientation shown in FIG. 5) toward the substrate 502. The electrical contacts 106 can be electrically coupled to one or more bond pads disposed on the substrate 502 having a corresponding pattern through a direct electrical connection. In some embodiments, an adhesive (e.g., an electrically conductive adhesive, a non-conductive adhesive, etc.) can be used to bond the structural frame 104 to the substrate 502 while allowing the electrical contacts 106 to make electrical connections with the bond pads on the substrate 502. In this embodiment, the electrical connections between the electrical contacts 106 extending through the structural frame 104 the one or more bond pads or trace conductors on the substrate 502 may allow the sense die 100 to be mounted on the substrate 502 without the need for wire bonds. Various techniques, such as thermosonic welding, thermo-compression welding, or other suitable techniques, can be used to provide an electrical connection between the electrical contacts 106 and the one or more corresponding bond pads or conductive traces on the substrate 502.

When the sense die 100 is coupled to the substrate, a force can be applied to the sense die 100 to place it in contact with the substrate 502. During this process, the structural frame 104 can be configured to support the application force without deforming (e.g., without permanent deformation). For example, a mechanical design and/or strength of the structural frame 104 can be sufficient to avoid being deformed during the application process of the sense die 100 being disposed on the substrate 502. This may provide for a consistent height between the diaphragm 102 and the surface of the substrate 502 that may not be affected by the force used to dispose the sense die 100 on the substrate. In contrast, other application processes can deform the connections, such as solder balls, which can result in inconsistent heights between the diaphragm and the surface of the substrate 502.

The resulting structure may provide the structural frame 104 to be in contact with a surface of the substrate 502. While some small amount of adhesive or other material may be present between the structural frame 104 and a surface of the substrate 502, the height 140 between the diaphragm 102 and the surface of the substrate 502 may be controlled by the height 140 of the structural frame 104.

While shown as being flip-chip mounted, other suitable connection techniques including the use of external bond pads with wire bonds can also be used. In this embodiment, the structural frame may provide the physical spacing height 140 between the diaphragm 102 and the surface of the substrate 502 needed to support the diaphragm 102 as it deflects, while the wire bonds provide the electrical connections for detecting the deflection of the diaphragm 102.

In various embodiments, the space between the sense die 100 and the substrate 502 can be sealed or otherwise provided with a controlled pressure or force. For example, the space between the sense die 100 and the substrate 502 can be sealed to form a reference pressure cavity against which a differential pressure can be measured. In some embodiments, a port or other opening can be present in the substrate 502 and/or the structural frame 104 to allow the space between the sense die 100 and the substrate 502 to be at approximately ambient pressure (e.g., atmospheric or any other ambient pressure). The sense die 100 can then be used to detect a force placed on the side of the diaphragm 102 opposite the substrate 502.

In operation, when a current is applied to the piezoresistive sensing elements (e.g., arranged in a full or half Wheatstone bridge configuration electrical output signal may be generated that is related to the degree of deflection of the diaphragm 102, and thus the force applied to the sense die 100. A resulting deflection of the diaphragm 102 can change the resistance of the sensing elements, and the resulting output voltage can then be detected and correlated or otherwise related to a force.

As an example of the change in the resistance, the resistive elements 120, 124 are mounted radially on the diaphragm 102, and connected by broader pads on the diaphragm 102. The resistive elements 122, 126 are mounted circumferentially or perpendicular to a radial line and are connected by broader pads on the diaphragm. As the diaphragm flexes, the length of the radial resistive elements 120, 124 increases and the width decreases to cause an increase in the resistance through these elements. In contrast, the circumferential resistive elements 122, 126 can experience a width increase or be unchanged as the diaphragm 102 flexes, so that the resistance can either decrease or remain the same. When arranged in a Wheatstone bridge, the increase in resistance in the radial elements 120, 124 can then be used to detect the degree of flexing of the diaphragm 102 in response to a force or pressure.

As discussed above, the height 140 can be relatively small and can serve to prevent excess deflection of the diaphragm during use. Under operation of the sense die 100 within the normal operating force or pressure ranges, the diaphragm 102 can deflect, and the resulting voltage output can be detected to determine a force or pressure on the diaphragm 102. When a pressure or force above a threshold is placed on the diaphragm, the diaphragm 102 may deflect into contact with a surface of the substrate 502. The contact between the diaphragm 102 and the substrate 502 may prevent further deflection of the diaphragm 102 being a burst force or deflection. In some embodiments, the diaphragm 102 may tend to flatten out into contact with the surface of the substrate 502, and the substrate 502 can serve to support the diaphragm 102 as it deflects.

The height 140 of the structural frame 104 determines the amount of deflection available for the diaphragm before the diaphragm contacts the surface of the substrate 502. The height 140 can vary and may be based on the thickness of the diaphragm, the pressure or force range of interest, a type of actuation element used (if any), and the configuration of the resistive elements. The ability to carefully control the height 140 between the diaphragm 102 and the substrate 502 may allow for careful overpressure control in the sense die.

Control of the height 140 can be achieved during the manufacturing process. In some embodiments, the structural frame 104 and the electrical contacts 106 can be formed on a wafer level prior to dicing the sense dies into individual components. The use of wafer level manufacturing techniques may allow careful control of the structural frame 104 with a height 140 to without about 0.5 microns, within about 0.2 microns, or within about 0.1 microns.

Figure 6:
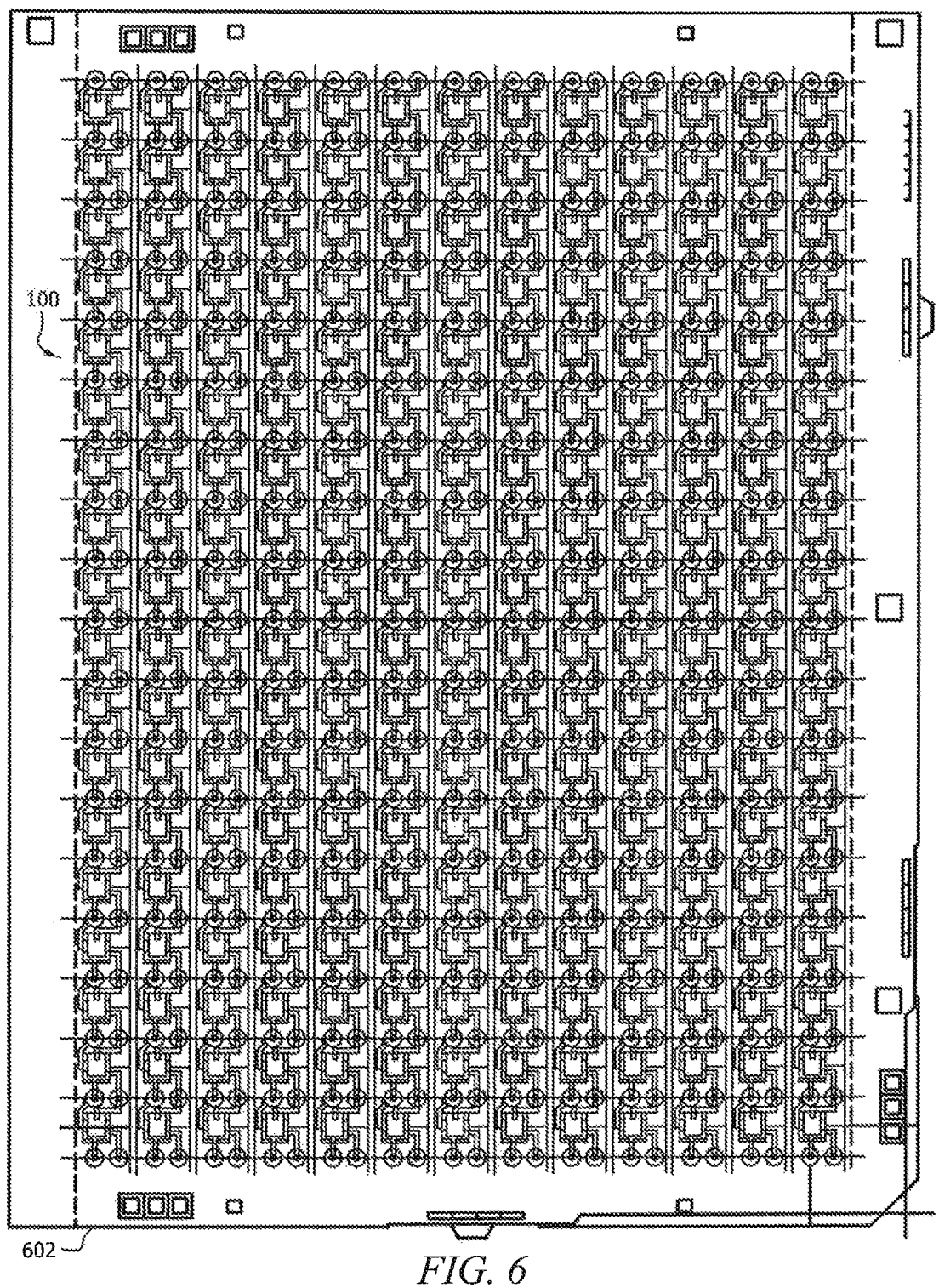
FIG. 6 is a schematic top view of a wafer comprising a plurality of sense die according to an embodiment.

In an embodiment as shown in FIG. 6, a plurality of sense dies can be formed on a single wafer 602. The number and arrangement of sense dies that can be formed can vary and may depend on the size of the wafer, the size of the sense dies, and the arrangement of the sense dies on the wafer. As described herein, a variety of techniques, such as lithography techniques, wet etching techniques, dry etching techniques, and the like can be used to form the sense dies, including the diaphragm, the resistive elements, the bond pads, the metal leadouts, and the optional protective coating (when present). When a protective coating is used, the protective coating can be deposited on a wafer level and etched to a desired height and configuration using various etching techniques.

In an embodiment, the structural frame can then be formed. Since the structural frame 104 may be formed once the other structures exist, the materials used to form the structural frame 104 may be disposed at conditions that may not damage the existing components (e.g., at a suitable temperature and using suitable chemicals to avoid damaging the existing structures). In an embodiment, the structural frame material can be disposed across the wafer. For example, the material can be spin coated on the structural material. The deposition process can be used to control the height by disposing the material to a desired final height and/or through post processing (e.g., etching, polishing, etc.) to obtain the desired height 140 above the diaphragm.

Once the material has been formed, various lithography techniques, wet etching techniques, dry etching techniques, and the like can be used to remove the material over the diaphragm and any other desired portions (e.g., over the desired electrical connection locations) to form the structural frame 104. An electrical material can be applied within the structural frame material before, during, or after the removal of the structural frame material over the diaphragm. The conductive material can then be formed to provide electrical connections through the structural frame 104. The wafer 602 can then be diced to produce the plurality of sense dies 100. By forming the structural frame 104 on the wafer level, the height may be carefully controlled to provide a desired height between the diaphragm and a surface of a substrate to which the sense die is attached.

Having described various devices, system is, and methods herein, specific embodiments can include, but are not limited to:

In a first embodiment, a sense die comprises a chip comprising a sense diaphragm; one or more sense elements supported by the diaphragm; one or more bond pads supported by a first side of the chip, each of the one or more bond pads electrically coupled to at least one of the one or more sense elements; a structural frame disposed on the first side of the chip, wherein the structural frame is disposed at least partially about the diaphragm; and one or more electrical contacts extending through the structural frame, wherein the one or more electrical contacts are electrically coupled to the one or more bond pads.

A second embodiment can include the sense die of the first embodiment, wherein the one or more electrical contacts are level with a surface of the structural frame.

A third embodiment can include the sense die of the first or second embodiment, further comprising a protective coating disposed on the first side of the chip.

A fourth embodiment can include the sense die of any of the first to third embodiments, wherein the structural frame is formed from an electrically insulating material.

A fifth embodiment can include the sense die of any of the first to fourth embodiments, wherein the structural frame is formed from a material selected from the group consisting of: silicon oxide, silicon nitride, silicon oxynitride, aluminum nitride, diamond like-carbon, boron-silicate glass, a spin-on glass, a silicone, a polymerized imide, a parylene, a polymerized benzocyclobutene, an organosilicate dielectric, a synthetic material, a cured resin, and any combination thereof.

A sixth embodiment can include the sense die of any of the first to fifth embodiments, further comprising: a side wall extending from a second side of the chip; and an actuation element retained in contact with the diaphragm within the side wall.

A seventh embodiment can include the sense die of any of the first to sixth embodiments, wherein the structural frame has a height above a surface of the diaphragm on the first side of between about 0.1 microns and about 8 microns.

An eighth embodiment can include the sense die of any of the first to seventh embodiments, further comprising signal conditioning circuitry, wherein the signal conditioning circuitry is in signal communication with the one or more sense elements, and wherein the signal conditioning circuitry is configured to provide an indication of a force or pressure on the diaphragm.

In a ninth embodiment, a method of manufacturing a sense die comprises: providing a wafer comprising a plurality of sense die, wherein each sense die of the plurality of sense die comprises a chip having a diaphragm formed thereon; disposing a structural frame material on the wafer, wherein the structural frame material has a height; forming a structural frame around each diaphragm of each sense die; and dicing the wafer to form one or more sense die comprising a single diaphragm.

A tenth embodiment can include the method of the ninth embodiment, further comprising forming one or more electrical contacts through the structural frame, wherein the electrical contacts are in electrical contact with one or more sense elements supported by the diaphragm.

An eleventh embodiment can include the method of the tenth embodiment, wherein a surface of the one or more electrical contacts is level with a surface of the structural frame.

A twelfth embodiment can include the method of any of the ninth to eleventh embodiments, wherein the wafer comprises a protective coating over at least the diaphragm.

A thirteenth embodiment can include the method of any of the ninth to twelfth embodiments, further comprising coupling a sense die of the one or more sense die to a substrate, wherein a height between a surface of the diaphragm and a surface of the substrate is determined by a height of the structural frame.

A fourteenth embodiment can include the method of the thirteenth embodiment, wherein the height between the surface of the diaphragm and the surface of the substrate is between about 0.1 microns and about 8 microns.

A fifteenth embodiment can include the method of any of the ninth to fourteenth embodiments, wherein the structural frame material comprises a material selected from the group consisting of: silicon oxide, silicon nitride, silicon oxynitride, aluminum nitride, diamond like-carbon, boron-silicate glass, a spin-on glass, a silicone, a polymerized imide, a parylene, a polymerized benzocy-clohutene, an organosilicate dielectric, a synthetic material, a cured resin, and any combination thereof.

In a sixteenth embodiment, a sense die comprises: a chip comprising a sense diaphragm, wherein the chip comprises a first side and a second side; a structural frame disposed on the first side of the chip, wherein the structural frame is disposed at least partially about the diaphragm; and a substrate, wherein the chip is coupled to the substrate, wherein the structural frame is in contact with a surface of the substrate, and wherein a height between a surface of the diaphragm on the first side of the chip and a surface of the substrate facing the diaphragm is determined by a height of the structural frame.

A seventeenth embodiment can include the sense die of the sixteenth embodiment, further comprising: one or more electrical contacts extending through the structural frame, wherein the one or more electrical contacts are electrically coupled to a first plurality of bond pads on the chip, wherein the substrate comprises a second plurality of bond pads, and wherein the one or more electrical contacts directly electrically couple the first plurality of bond pads to the second plurality of bonds pads.

An eighteenth embodiment can include the sense die of the seventeenth embodiment, wherein the one or more electrical contacts are level with a surface of the structural frame.

A nineteenth embodiment can include the sense die of any of the sixteenth to eighteenth embodiments, wherein the height between a surface of the diaphragm on the first side of the chip and a surface of the substrate facing the diaphragm is between about 0.1 microns and about 8 microns.

A twentieth embodiment can include the sense die of any of the sixteenth to nineteenth embodiments, further comprising: a side wall extending from a second side of the chip; and an actuation element retained in contact with the diaphragm within the side wall.

While various embodiments in accordance with the principles disclosed herein have been shown and described above, modifications thereof may be made by one skilled in the art without departing from the spirit and the teachings of the disclosure. The embodiments described herein are representative only and are not intended to be limiting. Many variations, combinations, and modifications are possible and are within the scope of the disclosure. Alternative embodiments that result from combining, integrating, and/or omitting features of the embodiment(s) are also within the scope of the disclosure. Accordingly, the scope of protection is not limited by the description set out above, but is defined by the claims which follow, that scope including all equivalents of the subject matter of the claims. Each and every claim is incorporated as further disclosure into the specification, and the claims are embodiment(s) of the present invention(s). Furthermore, any advantages and features described above may relate to specific embodiments, but shall not limit the application of such issued claims to processes and structures accomplishing any or all of the above advantages or having any or all of the above features.

Additionally, the section headings used herein are provided for consistency with the suggestions under 37 C.F.R. 1.77 or to otherwise provide organizational cues. These headings shall not limit or characterize the invention(s) set out in any claims that may issue from this disclosure. Specifically and by way of example, although the headings might refer to a "Field," the claims should not be limited by the language chosen under this heading to describe the so-called field. Further, a description of a technology in the "Background" is not to be construed as an admission that certain technology is prior art to any invention(s) in this disclosure. Neither is the "Summary" to be considered as a limiting characterization of the invention(s) set forth in issued claims. Furthermore, any reference in this disclosure to "invention" in the singular should not be used to argue that there is only a single point of novelty in this disclosure. Multiple inventions may be set forth according to the limitations of the multiple claims issuing from this disclosure, and such claims accordingly define the invention(s), and their equivalents, that are protected thereby. In all instances, the scope of the claims shall be considered on their own merits in light of this disclosure, but should not be constrained by the headings set forth herein.

Use of broader terms such as comprises, includes, and having should be understood to provide support for narrower terms such as consisting of, consisting essentially of, and comprised substantially of. Use of the term "optionally," "may," "might," "possibly," and the like with respect to any element of an embodiment means that the element is not required, or alternatively, the element is required, both alternatives being within the scope of the embodiment(s). Also, references to examples are merely provided for illustrative purposes and are not intended to be exclusive.

While several embodiments have been provided in the present disclosure, it should be understood that the disclosed systems and methods may be embodied in many other specific forms without departing from the spirit or scope of the present disclosure. The present examples are to be considered as illustrative and not restrictive, and the intention is not to be limited to the details given herein. For example, the various elements or components may be combined or integrated in another system, or certain features may be omitted or not implemented.

Also, techniques, systems, subsystems, and methods described and illustrated in the various embodiments as discrete or separate may be combined or integrated with other systems, modules, techniques, or methods without departing from the scope of the present disclosure. Other items shown or discussed as directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made without departing from the spirit and scope disclosed herein.

What is claimed is:

1. A sense die comprising:
   a chip comprising a sense diaphragm;
   one or more sense elements supported by the diaphragm;
   one or more bond pads supported by a first side of the chip, each of the one or more bond pads electrically coupled to at least one of the one or more sense elements;
   a structural frame disposed on the first side of the chip, wherein the structural frame is disposed at least partially about the diaphragm; and
   one or more electrical contacts extending through the structural frame, wherein the one or more electrical contacts are electrically coupled to the one or more bond pads.

2. The sense die of claim 1, wherein the one or more electrical contacts are level with a surface of the structural frame.

3. The sense die of claim 1, further comprising a protective coating disposed on the first side of the chip.

4. The sense die of claim 1, wherein the structural frame is formed from an electrically insulating material.

5. The sense die of claim 1, wherein the structural frame is formed from a material selected from the group consisting of: silicon oxide, silicon nitride, silicon oxynitride, aluminum nitride, diamond like-carbon, boron-silicate glass, a spin-on glass, a silicone, a polymerized imide, a parylene, a polymerized benzocyclobutene, an organosilicate dielectric, a synthetic material, a cured resin, and any combination thereof.

6. The sense die of claim 1, further comprising:
   a side wall extending from a second side of the chip; and
   an actuation element retained in contact with the diaphragm within the side wall.

7. The sense die of claim 1, wherein the structural frame has a height above a surface of the diaphragm on the first side of between 0.1 microns and 8 microns.

8. The sense die of claim 1, further comprising signal conditioning circuitry, wherein the signal conditioning circuitry is in signal communication with the one or more sense elements, and wherein the signal conditioning circuitry is configured to provide an indication of a force or pressure on the diaphragm.

9. A sense die comprising:
   a chip comprising a diaphragm, wherein the chip comprises a first side and a second side;
   a structural frame disposed on the first side of the chip, wherein the structural frame is disposed at least partially about the diaphragm; and
   a substrate, wherein the chip is coupled to the substrate, wherein the structural frame is in contact with a surface of the substrate,
   wherein the structural frame is disposed between the first side of the chip and the surface of the substrate, and
   wherein a height between a surface of the diaphragm on the first side of the chip and a surface of the substrate facing the diaphragm is determined by a height of the structural frame.

10. The sense die of claim 9, further comprising:
    one or more electrical contacts extending through the structural frame,
    wherein the one or more electrical contacts are electrically coupled to a first plurality of bond pads on the chip,
    wherein the substrate comprises a second plurality of bond pads, and
    wherein the one or more electrical contacts directly electrically couple the first plurality of bond pads to the second plurality of bonds pads.

11. The sense die of claim 10, wherein the one or more electrical contacts are level with a surface of the structural frame.

12. The sense die of claim 9, wherein the height between a surface of the diaphragm on the first side of the chip and the surface of the substrate facing the diaphragm is between 0.1 microns and 8 microns.

13. The sense die of claim 9, further comprising:
    a side wall extending from the second side of the chip; and
    an actuation element retained in contact with the diaphragm within the side wall.

* * * * *